(12) United States Patent
Lowles

(10) Patent No.: US 7,760,975 B2
(45) Date of Patent: Jul. 20, 2010

(54) SHARED LIGHT PIPE FOR MESSAGE INDICATOR AND LIGHT SENSOR

(75) Inventor: Robert J. Lowles, Waterloo (CA)

(73) Assignee: Research In Motion Limited, Waterloo, Ontario (CA)

( * ) Notice: Subject to any disclaimer, the term of this patent is extended or adjusted under 35 U.S.C. 154(b) by 0 days.

(21) Appl. No.: 12/032,367

(22) Filed: Feb. 15, 2008

(65) Prior Publication Data

US 2008/0199127 A1  Aug. 21, 2008

Related U.S. Application Data

(62) Division of application No. 11/187,867, filed on Jul. 25, 2005, now Pat. No. 7,352,930.

(51) Int. Cl.
G02B 6/42 (2006.01)
H04B 1/38 (2006.01)
G01J 5/08 (2006.01)

(52) U.S. Cl. .............. 385/45; 385/14; 385/31; 385/39; 385/50; 385/129; 385/132; 455/566; 250/227.11

(58) Field of Classification Search ......... 385/12, 385/14, 31, 39, 45, 50, 88, 92, 129, 132; 455/566; 250/227.1, 227.11
See application file for complete search history.

(56) References Cited

U.S. PATENT DOCUMENTS

| | | | |
|---|---|---|---|
| 3,964,824 A | 6/1976 | Dixon et al. | |
| 4,576,436 A | 3/1986 | Daniel et al. | |
| 4,826,273 A | 5/1989 | Tinder et al. | |
| 5,963,687 A | 10/1999 | Schneider et al. | |
| 6,435,690 B1 | 8/2002 | Till | |
| 6,687,515 B1* | 2/2004 | Kosaka | 455/566 |
| 6,753,842 B1 | 6/2004 | Williams et al. | |
| 6,904,221 B2* | 6/2005 | Yasuda et al. | 385/132 |

(Continued)

FOREIGN PATENT DOCUMENTS

DE  44 11 860 A1  10/1995

(Continued)

OTHER PUBLICATIONS

Weslake, Daniel, Examiner, Office Action, Aug. 6, Canadian Intellectual Property Office.

(Continued)

Primary Examiner—Charlie Peng
Assistant Examiner—Michael P Mooney
(74) Attorney, Agent, or Firm—Perry + Currier Inc.

(57) ABSTRACT

A shared light pipe is set forth for transmitting light generated by a message waiting LED in a mobile communication device, in one direction, and transmitting ambient or surrounding light, in an opposite direction, to a light sensor for controlling a display backlight of the device. The light pipe includes an elongated first portion having a first end for receiving and transmitting light and external surfaces for reflecting light there through via total internal reflection (TIR), a second portion coextensive with the first portion for outputting light received at the first end and reflected through the first portion, and a second branch coextensive with the first portion for receiving and transmitting light for output at the first end.

9 Claims, 1 Drawing Sheet

U.S. PATENT DOCUMENTS

| | | |
|---|---|---|
| 7,042,341 B2 | 5/2006 | McMahon |
| 2003/0058657 A1 | 3/2003 | Rogers et al. |
| 2004/0013372 A1* | 1/2004 | Gancarcik et al. ............. 385/88 |
| 2004/0208632 A1* | 10/2004 | Dietz et al. ................. 398/182 |

FOREIGN PATENT DOCUMENTS

| | | | |
|---|---|---|---|
| EP | 1 303 113 | A2 | 4/2003 |
| EP | 1 336 883 | A1 | 8/2003 |
| EP | 1 253 447 | A2 | 10/2004 |
| EP | 1 696 259 | A1 | 8/2007 |
| JP | 60059548 | A | 4/1985 |
| JP | 02053040 | | 2/1990 |
| JP | 05218581 | A | 8/1993 |
| JP | 06 130386 | A | 5/1994 |
| JP | 07203124 | A | 8/1995 |
| JP | 11 260572 | A | 9/1999 |
| JP | 2000292631 | A | 10/2000 |
| JP | 2001215350 | A | 8/2001 |
| JP | 2002 300233 | A | 11/2002 |
| JP | 2003 198668 | A | 7/2003 |
| JP | 2004 309973 | A | 4/2004 |
| WO | 200105125 | A1 | 1/2001 |

OTHER PUBLICATIONS

European Search Report, European Patent Office, Nov. 18, 2005.
European Search Report, European Patent Office, Aug. 1, 2006.
European Search Report, European Patent Office, Apr. 12, 2007.
European Search Report, European Patent Office, Apr. 17, 2007.

\* cited by examiner

SHARED LIGHT PIPE FOR MESSAGE INDICATOR AND LIGHT SENSOR

CROSS-REFERENCE TO RELATED APPLICATION

This is a divisional of U.S. patent application Ser. No. 11/187,867, filed Jul. 25, 2005 now U.S. Pat. No. 7,352,930, the contents of which are incorporated herein by reference.

FIELD

The following is directed in general to light pipes, and more particularly to a shared light pipe for message indicator and light sensor on a mobile communication device.

BACKGROUND

Mobile communication devices are becoming increasingly popular for business and personal use due to a relatively recent increase in number of services and features that the devices and mobile infrastructures support. Handheld mobile communication devices, sometimes referred to as mobile stations, are essentially portable computers having wireless capability, and come in various forms. These include Personal Digital Assistants (PDAs), cellular phones and smart phones. The user interface for such devices typically includes, a keyboard, a message waiting indicator to indicate received voice or email messages, and an LCD display.

The message waiting indicator typically comprises an LED mounted to a printed circuit board (PCB) within the device and a light pipe (sometimes referred to as a light guide) for transmitting light via Total Internal Reflection (TIR) from the LED to the surface of the device, so as o be visible to the user. The circuitry within the device causes the LED to flash upon receipt of a message, thereby notifying the user. The design and operation of such circuitry would be well known to a person of skill in the art, and does not form part of the present specification.

The LCD display typically includes a backlight control device to control variable brightness or to maintain the brightness of the display. The backlight control device includes a backlight lamp mounted on the back of an LCD to emit light, a light sensor for measuring intensity of the external or surrounding light, and an A/D converter for converting an electric signal, detected and generated by the light sensor, into a digital signal for controlling the backlight lamp.

It is highly desirable to minimize the size of such mobile communication devices for enhanced portability. However, incorporation of the light sensor consumes valuable real-estate on the surface of the device, and may detract from the appearance of the device.

Aspects and advantages will be apparent to a person of ordinary skill in the art, residing in the details of construction and operation as more fully hereinafter described and claimed, reference being had to the accompanying drawings.

BRIEF DESCRIPTION OF THE DRAWINGS

A detailed description of the preferred embodiment is set forth in detail below, with reference to the following drawings, in which.

DETAILED DESCRIPTION

According to an aspect of this specification, a shared light pipe is provided for transmitting light generated by the internal message waiting LED, in one direction, and transmitting ambient or surrounding light, in an opposite direction, to an internal light sensor for controlling the backlight. Unlike the prior art, the shared light pipe as disclosed herein facilitates reduced size of the mobile communication device by minimizing real-estate on the surface of the device and on the PCB because the LED and light sensor can be placed very close together.

Figure 1:
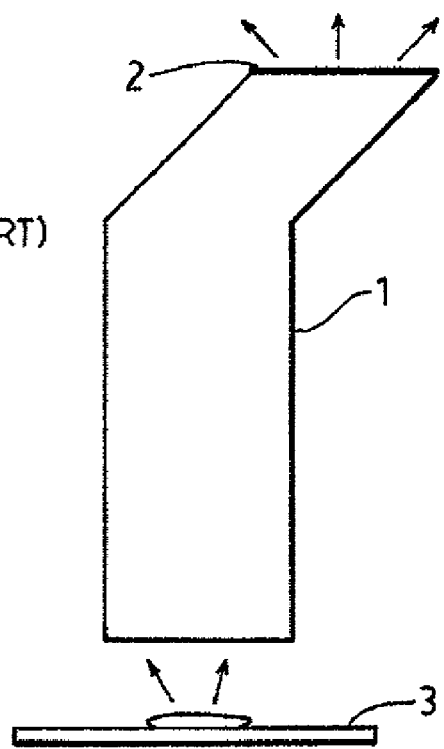
FIG. 1 is schematic representation of a message waiting indicator for a mobile communication device according to the prior art.

With reference to FIG. 1, a prior art message waiting indicator is shown comprising a light pipe 1 for transmitting light from a message LED 3 to a viewing surface 2 flush with the surface of a mobile communication device (not shown). The light pipe 1 generally comprises an elongated transparent or translucent member having reflection surfaces. As well known in the art, when a light ray is directed from the LED 3 into the light pipe and subtends a surface of the light pipe, if the incident angle formed by the light ray and the surface is less than a critical angle, the light is reflected back into the light pipe along a trajectory that defines a reflected angle equal to the incident angle and toward an opposite surface of the guide. Provided the light pipe 1 is designed properly and light rays directed into it are directed along suitable trajectories, the light pipe facilitates total internal reflection (TIR) of the light and hence passes all of the light to the opposite end 2 of the guide for viewing by a user. As discussed above, circuitry is provided within the device for causing the LED to flash upon receipt of a message, thereby notifying the user. The electronic circuitry is not shown, but would be well known to a person of skill in the art.

As discussed above, a light sensor may also be provided for controlling the display backlight. According to the prior art, such a light sensor is separate from the message indicator and is mounted directly to the surface of the mobile communication device.

Figure 2:
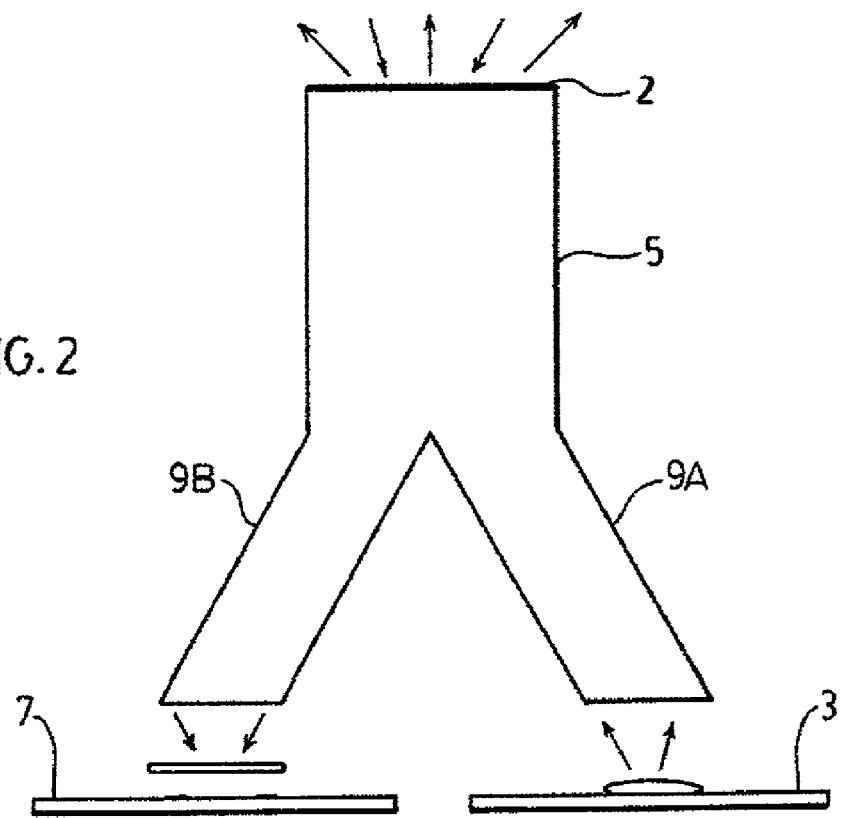
FIG. 2 is a schematic representation of a shared light pipe for message indicator and light sensor, according to the preferred embodiment.

According to the preferred embodiment of FIG. 2, a shared light pipe 5 is provided for transmitting light from the message LED 3 to the surface 2, as discussed above in connection with FIG. 1. However, the shared light pipe 5 contains a pair of branches at a distal portion thereof, opposite the viewing surface, where one branch 9A channels light from the LED 3, and the other branch channels light to the internal light sensor 7.

Preferably, the light pipe as disclosed herein, is molded from polycarbonate or acrylic, although it can alternatively be selected from bar stock.

In operation, the message light LED 3 is typically flashed according to the following pattern: 0.5 second on, 3 to 5 seconds off. The light sensor 7 is read by an internal processor (not shown) when the message LED 3 is off, thereby avoiding interference between generated and sensed light within the light pipe 5.

Although not directly relevant to this disclosure, three readings are typically recorded from light sensor 7 in order to manage the backlighting function. A self test can also be performed by illuminating the LED 3 while taking a measurement at the light sensor 7, thereby confirming the presence of both the LED 3 and sensor 7. Additionally, if the LED 3 has multiple colours then the light sensor 7 can be used to confirm that as well (a test typically performed during the device manufacturing process).

In summary, the shared light pipe set forth herein effectively facilitates reduced size of the mobile communication device by minimizing real-estate on the surface of the device and on the PCB, and also minimizes the number of light pipes required for message light display and light sensing.

A person skilled in the art, having read this description of the preferred embodiment, may conceive of variations and alternative embodiments. For example, although the preferred embodiment refers to implementation within a mobile communication device (such as a PDA, cellular phone or smart phone), it is contemplated that the shared light pipe set forth herein may also be employed to advantage within desktop telephones, pagers or other communication devices.

All such variations and alternative embodiments are believed to be within the ambit of the claims appended hereto.

What is claimed is:

1. A method of operating a message light source and an ambient light sensor optically connected via a shared light guide in a communication device, said ambient light sensor being located at a first internal location within the device, said message light source being located at a second internal location within the device, and said shared light guide including a first branch through which a first light path extends for conveying light from an external location to said first internal location, a second branch through which a second light path extends for conveying light from said second internal location to the external location, a third branch for receiving and transmitting light, through which coincident pads of the light paths extend, comprising:
   flashing said message light on and off according to a predetermined pattern, wherein said predetermined pattern is approximately 0.5 seconds on, followed by from approximately 3 to approximately 5 seconds off; and
   selectively reading an output of said light sensor exclusively when said light source is not on.

2. The method of claim 1 further comprising the steps of:
   receiving light at said external location on the external surface of said device;
   transmitting the light via a light guide from the external location to said light sensor located at said first internal location within the device;
   emitting light at said second internal location within the device;
   emitting light at a third internal location within the device;
   monitoring the light received at the first internal location and modifying the intensity of light emitted at the third internal location in accordance with the intensity of light received at the first internal location;
   transmitting light along said first light path from the external location to the first internal location; and
   transmitting light along said second light path from the second internal location to the external location;
   such that the first and second light paths are coincident over at least a pad of said paths.

3. A mobile communication device comprising a light source and an ambient light sensor optically connected via a shared lightguide, the communication device comprising:
   means for controlling flashing said light source on and off in a predetermined pattern, wherein said predetermined pattern is approximately 0.5 seconds on, followed by from approximately 3 to approximately 5 seconds off; and
   means for activating the sensor to sense light in accordance with periods of the light source not being on.

4. The mobile communication device of claim 3, further comprising:
   an external location on the external surface of said device for receiving light;
   a light sensor located at a first internal location within the device;
   a first light source located at a second internal location within the device;
   a means for monitoring the output signal of the light sensor;
   a first modifying means for modifying the intensity of a second light source in accordance with the intensity of light received by the light sensor; and
   a light guide, having a first branch, through which a first light path extends for conveying light from the external location to the first internal location; a second branch through which a second light path extends for conveying light from the second internal location to the external location; and a third branch for receiving and transmitting light, through which the coincident parts of the light paths extend, wherein the first and second light paths are coincident over at least a pad of said paths.

5. The mobile communication device of claim 4 wherein light is transmitted along the branches by means of total internal reflection (TIR).

6. The mobile communication device of claim 5, wherein said first portion, first branch and second branch are fabricated from translucent or transparent material.

7. The mobile communication device of claim 6, wherein said material is moulded from polycarbonate or acrylic.

8. The mobile communication device of claim 4, wherein the first light source is a light emitting diode "LED".

9. The mobile communication device of claim 4, wherein the light pipe is generally Y-shaped.

* * * * *